United States Patent
Palangappa (10) Patent No.: US 11,265,016 B2
(45) Date of Patent: Mar. 1, 2022

(54) DECODING APPARATUS, DEVICE, METHOD AND COMPUTER PROGRAM

(71) Applicant: Intel Corporation, Santa Clara, CA (US)

(72) Inventor: Poovaiah Palangappa, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/920,808

(22) Filed: Jul. 6, 2020

(65) Prior Publication Data

US 2022/0006471 A1    Jan. 6, 2022

(51) Int. Cl.
*H03M 13/11*    (2006.01)
*H03M 13/37*    (2006.01)

(52) U.S. Cl.
CPC ...... *H03M 13/116* (2013.01); *H03M 13/1105* (2013.01); *H03M 13/3746* (2013.01)

(58) Field of Classification Search
CPC ........... H03M 13/116; H03M 13/1105; H03M 13/3746
See application file for complete search history.

(56) References Cited

U.S. PATENT DOCUMENTS

| 9,564,931 B1 | 2/2017 | Nguyen et al. |
| 2004/0098659 A1* | 5/2004 | Bjerke ............. H03M 13/6393 714/776 |
| 2005/0154958 A1* | 7/2005 | Xia ..................... H04L 1/0051 714/752 |
| 2006/0020868 A1* | 1/2006 | Richardson .......... H03M 13/116 714/752 |
| 2012/0084625 A1 | 4/2012 | Pisek et al. |
| 2012/0185744 A1 | 7/2012 | Varnica et al. |

* cited by examiner

*Primary Examiner* — Thien Nguyen
(74) *Attorney, Agent, or Firm* — 2SPL Patent Attorneys PartG mbB; Yong Beom Hwang (57) ABSTRACT

Examples relate to a decoding apparatus, a decoding device, a decoding method, a decoding computer program, and a communication device, a memory device and a storage device comprising such a decoding apparatus or decoding method. A decoding apparatus for performing iterative decoding on a codeword comprises processing circuitry comprising a plurality of processing units, and control circuitry configured to control the iterative decoding of the codeword. The iterative decoding is based on a parity-check matrix. The matrix is sub-divided into two or more partitions. The control circuitry is configured to operate in a first mode of operation to process a codeword having a first length, and to operate in a second mode of operation to process a codeword having a second length. The control circuitry is configured to multiplex the utilization of the plurality of processing units across the two or more partitions of the matrix at least in the second mode of operation.

20 Claims, 4 Drawing Sheets

| $\dfrac{e_{5Q}}{5}$ | $\dfrac{e_{5Q}-1}{5}$ | $\dfrac{e_{5Q}-2}{5}$ | $\dfrac{e_{5Q}-3}{5}$ | $\dfrac{e_{5Q}-4}{5}$ |
|---|---|---|---|---|
| $\dfrac{e_{5Q}-4}{5}$ | $\dfrac{e_{5Q}}{5}$ | $\dfrac{e_{5Q}-1}{5}$ | $\dfrac{e_{5Q}-2}{5}$ | $\dfrac{e_{5Q}-3}{5}$ |
| $\dfrac{e_{5Q}-3}{5}$ | $\dfrac{e_{5Q}-4}{5}$ | $\dfrac{e_{5Q}}{5}$ | $\dfrac{e_{5Q}-1}{5}$ | $\dfrac{e_{5Q}-2}{5}$ |
| $\dfrac{e_{5Q}-2}{5}$ | $\dfrac{e_{5Q}-3}{5}$ | $\dfrac{e_{5Q}-4}{5}$ | $\dfrac{e_{5Q}}{5}$ | $\dfrac{e_{5Q}-1}{5}$ |

DECODING APPARATUS, DEVICE, METHOD AND COMPUTER PROGRAM

FIELD

Examples relate to a decoding apparatus, a decoding device, a decoding method, a decoding computer program, and a communication device, a memory device and a storage device comprising such a decoding apparatus or decoding device.

BACKGROUND

It is becoming increasingly common to have wireless and/or wired communication to support error correcting codes with vastly different block lengths. However, having separate decoders for each of these block lengths can quickly bring the decoder silicon area to prohibitively high numbers. Therefore, the application might have to compromise by using a suboptimal code for some of the block lengths in favor of lowering the silicon cost. The parameters—cost and performance—might not be simultaneously optimized for the existing decoder designs.

For example, one of the following two approaches may be used to support codes with different lengths—(1) multiplexing codes in the decoder, or (2) use separate decoders for each code length. Multiplexing (muxing for short) codes in decoders, such as low-density parity-check code (LDPC) decoders, is an acceptable solution when the block lengths of the codes are comparable. When the sizes (block length) of the codes range across orders of magnitude (2× to 10×), then muxing the codes may become inefficient. It can sometimes lead to more silicon area than individual decoders combined, since the speed-up for each block length is not finely controlled when muxing codes. Using separate decoders may lead to longer development times and more silicon area being used, which are the primary factors that affect non-recurring engineering (NRE) costs and recurring engineering (RE) costs, respectively.

BRIEF DESCRIPTION OF THE FIGURES

Some examples of apparatuses and/or methods will be described in the following by way of example only, and with reference to the accompanying figures, in which.

DETAILED DESCRIPTION

Some examples are now described in more detail with reference to the enclosed figures. However, other possible examples are not limited to the features of these examples described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Various examples of the present disclosure relate to decoders, e.g. LDPC decoders, that are suitable for supporting multiple codes with vastly different block lengths. Various examples provide a method that can efficiently re-use the logic in decoders, such as LDPC decoders, so that a single decoding unit can support multiple block lengths—in other words, a flexible decoder is proposed. Various examples provide a method of using time-division multiplexing of decoding logic, as opposed to just logic multiplexing, to decode (LDPC) codes of largely different block lengths. In effect, the proposed concept spreads the decoding of the larger codewords into multiple time slots, without affecting their error correction performance; so that (LDPC) codes with vastly different block lengths can use the same decoder for decoding.

LDPC codes are a class of state-of-the-art error correcting codes (ECC) that offers superior error correction capabilities for communication and storage applications. Several new applications of LDPC codes, including future trends, show the need to deploy codes with vastly different block lengths. The proposed concept allows these applications to use an optimal code, e.g. an optimal LDPC code, for different block lengths with (1) low time to market, and (2) low cost. While the proposed concept is introduced in connection with LDPC codes, other codes that rely on iterative decoding may be applied as well.

Wireless channels (also applicable to storage media) are inherently noisy media—a bit that is transmitted and then received has a chance (probability) of being in error. This is termed as the raw bit error rate (RBER). However, if the RBER is to be reduced to the system acceptable error rates, then the data density (data per area) of the medium reduces to unacceptable limits.

This is why error correcting codes (ECC) are being used. ECC use a noisy medium (and some additional data overhead); ECCs may be constructed for the error rates acceptable by the system.

LDPC codes are a class of ECC that can provide low latency decoding, support soft information decoding, and is capacity achieving. LDPC codes are generally specified using a parity-check matrix (H matrix), which computes the syndrome (error signature comprising a bit vector) for a noisy codeword. Any codeword whose syndrome is zero may be considered to be a valid codeword. The process of decoding in LDPC codes comprises iteratively moving from a noisy codeword (syndrome is not all zeros) to a corrected codeword (syndrome is all zeros). There are several examples of decoding algorithms like bit-flip decoder, layered decoder, sum-product decoders, belief-propagation decoders, etc.

LDPC codes are represented (also defined) by its parity check matrix—also known as the H-matrix. In a type of matrix called "quasi-cyclic matrix", the H-matrix may be made up of circulant columns and circulant rows. Each member of the circulant column or row can be obtained by rotating the bits in the circulant. This enables using just one copy of the processing logic for a circulant column—all members of the circulant column can be processed using the same logic with circular rotations.

An iteration is performed over multiple clock cycles (i.e. time slots) as described above. The amount of processing that a decoder performs in one clock cycle/time slot is called as a sub iteration.

Ideally, the entire codeword can be processed with one copy of the processing logic for each circulant column in one sub iteration. However, this might not meet the throughput/latency requirements. Hence, multiple copies of processing logic are provided for each circulant column to speed up the processing. The number of copies of processing logic for each circulant is called the "speed up" of the decoder.

Some approaches use logical muxing (multiplexing) of codes. Whenever a controller/application needs to support more than one LDPC code, engineering efforts and silicon area may be saved by logically (here logic refers to digital logic) muxing between the codes in the decoder. This is an effective approach when the muxed codes have comparable block lengths and throughputs. The efficiency of this method may reduce as the block lengths of the code become vastly different. Logical muxing of codes of comparable block lengths may be used in some other approaches. Various examples of the present disclosure, however, may provide decoders that can support codes with vastly different block lengths—like 2x-10x.

In the following section, a simple example with two codes is used to describe the challenges and the approach. The two codes scenario can be extended to any number of codes that the application requires.

Figure 1A:
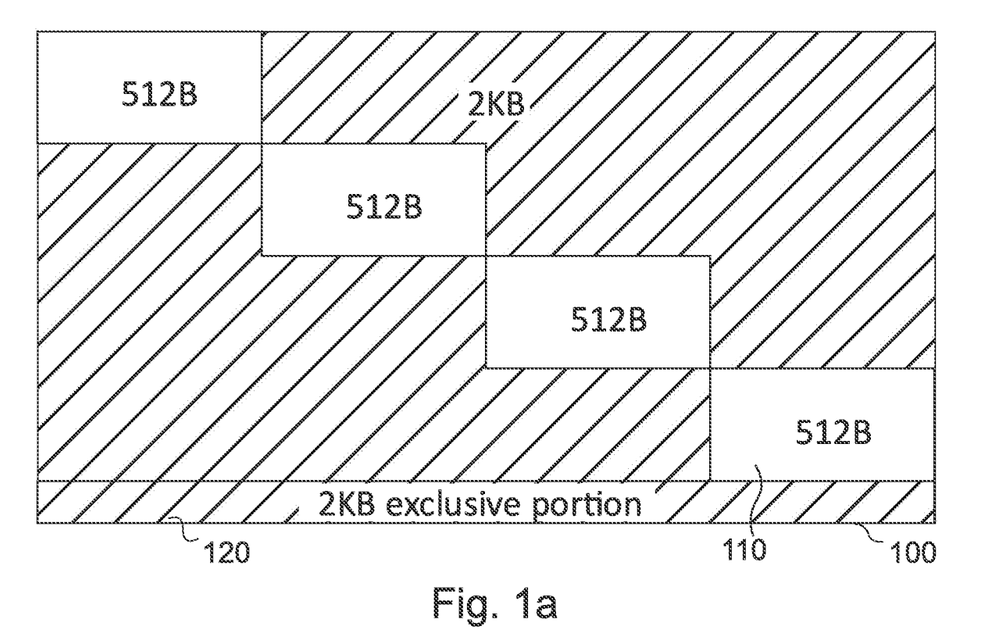
FIG. 1a shows a schematic diagram of an example of a constrained code where the application can operate either in 512B read mode or in a 2 KB read mode.

Without loss of generality and for ease of understanding, consider two codes, such as LDPC codes, one with block length 512B and the other with block length of 2 KB as shown in FIG. 1a. The blank portion of the parity check matrix represents the 512B portion and the shaded portion represents the 2 KB portion. This is a typical scenario being used in wireless communication (and also Multi-Gigabit-fast (MGfast) standards)—whenever decoding using 512B code fails, a larger chunk of the data may be read, and decoding may try using 2 KB.

FIG. 1a shows a schematic diagram of an example of a constrained code where the application can operate either in 512B read mode or in a 2 KB read mode. FIG. 1a shows a diagram of a matrix 100—the entire matrix may be used for decoding of 2 KB codes, including a section 120 that is exclusively used for 2 KB codewords. Four sub-matrices 110 may be used for decoding the 512B codes.

Since the 2 KB decoder is activated with a low probability (only when the 512B code fails), the throughput of the 2 KB decoder is not critical unlike the 512B code decoder.

Gate count may increase with (a) the block length and (b) the throughput that needs to be supported. The larger the block length of the 2 KB codes, the more check nodes and variable nodes may be required, which contribute to a large gate count. This may become aggravated when logical muxing of the 512B code and the 2 KB code is performed as shown in FIG. 1b.

Figure 1B:
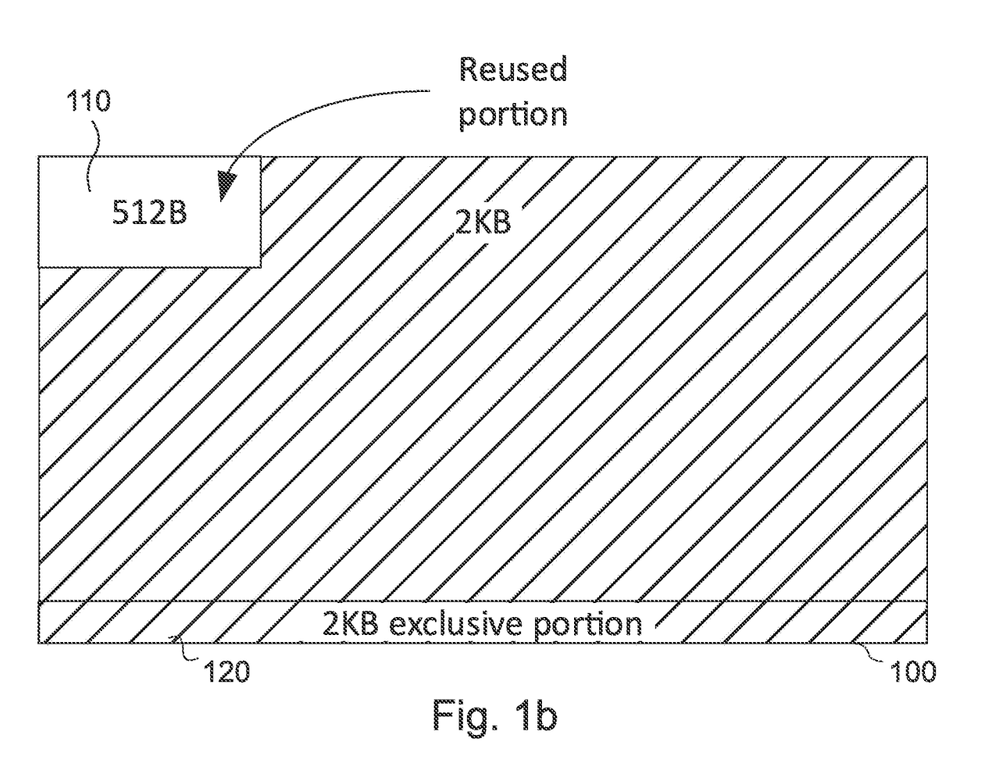
FIG. 1b shows a diagram illustrating the inefficiency of reuse for codes with vastly different block lengths.

FIG. 1b shows a diagram illustrating the inefficiency of reuse for codes with vastly different block lengths. This figure shows the inefficiency of logical muxing codes (existing/previous art) with vastly different block lengths. The key take-aways are (1) the logical muxing of 512B code might reuse only a tiny portion (denoted 110 in FIG. 1b) (2) logical muxing may force 2 KB code to use the same speedup as the 512B code, which is wasteful. This may force 512B and 2 KB codes to have the same speed up, resulting in 2 KB code to have higher level of throughput than that is actually needed. This may be wasteful of silicon area and force architectures where 512B codes and 2 KB codes have separate ECC decoders. Separate decoders may lead to a replication of the engineering efforts, and may delay the time to market causing increasing costs and project risks.

As a move towards (LDPC) codes with vastly different block lengths can be observed, the size of the combined decoder keeps increasing, which may increase the power, area, and physical design effort. Furthermore, supporting multiple decoders for an application may increase the engineering/development costs. A significantly large portion of the wireless/DSL (Digital Subscriber Line) controllers is used by the ECC decoders. Silicon area usage of these decoders and their engineering effort directly affect the cost of the product. Various examples may provide an efficient logic reuse for codes with vastly different block lengths, by decoupling the speed ups of the two decoders.

Figure 2A:
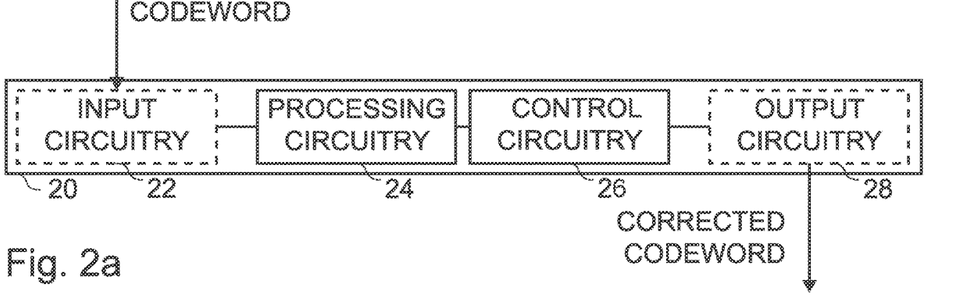
FIG. 2a shows a block diagram of an example of a decoding apparatus or decoding device.

FIG. 2a shows a block diagram of an example of a decoding apparatus or decoding device 20 for performing iterative decoding on a codeword. The components of the decoding device 20 are defined as component means, which may be implemented by the respective structural components of the decoding apparatus 20. The decoding apparatus/device comprises processing circuitry 24/processing means (i.e. means for processing) 24 comprising a plurality of processing units. The decoding apparatus/device 20 further comprises control circuitry 26/control means (i.e. means for controlling), which is/are coupled to the processing circuitry/means 24. The decoding apparatus/device 20 may further comprise one or more further optional components, such as input circuitry/input means 22 (e.g. for obtaining the codeword) and/or output circuitry/output means 28 (e.g. for providing a corrected codeword). For example, the input circuitry/means and/or the output circuitry/means may be coupled to the processing circuitry/means and/or the control circuitry/means.

The control circuitry/means is configured to control the iterative decoding of the codeword. The iterative decoding is based on a parity-check matrix. The matrix is sub-divided into two or more partitions. The control circuitry/means is configured to operate in a first mode of operation to process a codeword having a first length, and to operate in a second mode of operation to process a codeword having a second length. The control circuitry/means is configured to multiplex the utilization of the plurality of processing units across the two or more partitions of the matrix at least in the second mode of operation.

Figure 2B:
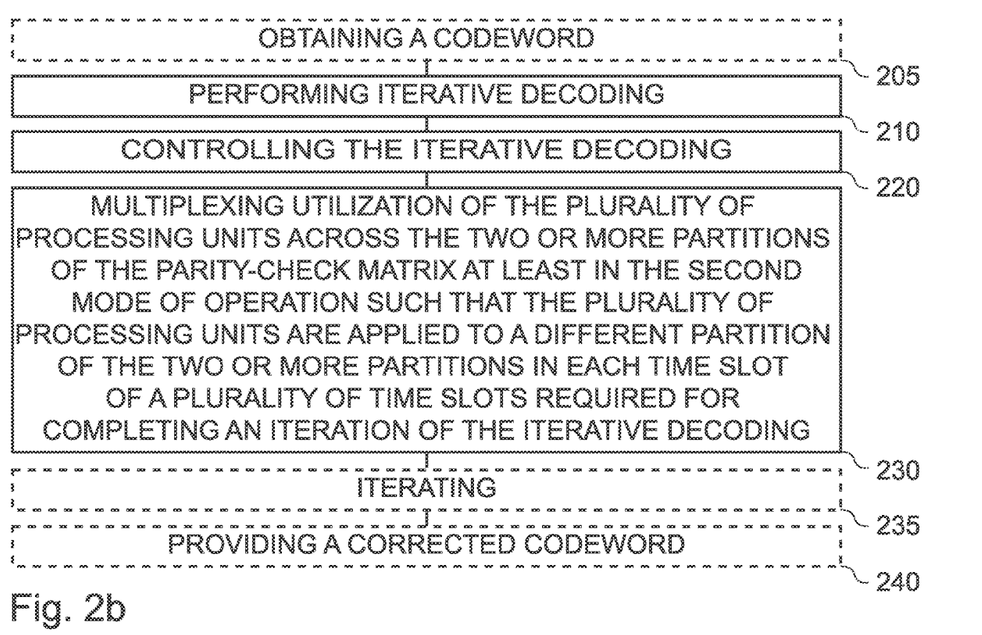
FIG. 2b shows a flow chart of an example of a decoding method.

FIG. 2b shows a flow chart of an example of a corresponding decoding method for performing iterative decoding on a codeword. The decoding method comprises performing 210 iterative decoding using a plurality of processing units. The method comprises controlling 220 the iterative decoding of the codeword, by operating in a first mode of operation to process a codeword having a first length, and operating in a second mode of operation to process a codeword having a second length. The method comprises multiplexing 230 the utilization of the plurality of processing units across the two or more partitions of the matrix at least in the second mode of operation. For example, the method may comprise obtaining 205 the codeword and/or providing 240 the corrected codeword.

The following description relates to the decoding apparatus/device and to the corresponding method.

The decoding apparatus, device and method are configured to perform iterative decoding on a codeword. While there are various coding schemes that employ an iterative decoding approach, the present concept is particularly suited for low-density parity-check code (LDPC) iterative decoding. For example, the decoding apparatus, device, and method may be suitable for performing LDPC iterative decoding. LDPC are codes that are being used to provide both error detection and error correction for codewords comprising LDPC parity information. Such codewords are, for example, used in communication systems for transmitting information over a lossy channel, or in memory or storage applications, where transmission and/or memory/storage errors can be recovered using such codes. In general, an LDPC decoder takes a codeword as an input, and uses a so-called parity-check matrix (also called H matrix) to calculate a syndrome of the codeword (using a matrix multiplication). For example, the aforementioned matrix may be an LDPC matrix, e.g. a parity-check matrix or H matrix. The component "low-density" in LDPC refers to the sparseness of the H matrix, in which only few non-zero elements (e.g. logical ones, or other non-binary values when a non-binary LDPC code is used) are interspersed among zeros. Accordingly, while the following description relates to "1s" and "0s", the same concept may be applied to "non-zero values" and "zero values". The syndrome indicates whether the codeword is correct—if the syndrome is 0 (i.e. all bits of the logical syndrome are logical 0) the codeword is correct. If not, or rather as long as this is not the case (and a maximal number of iterations has not been reached), an iterative process involving message passing is used to correct the code word, by passing "messages" between the variable bit nodes (of the codeword) and the so-called check nodes (of the syndrome) according to a decoder algorithm. In various examples, the term "full iteration" may refer to one iteration of the iterative decoding being completed.

At the respective bit nodes or check nodes, the message being passed in input into a logical and/or mathematical transformation, and the result of the transformation is passed back to the respective other nodes. In general terms, the functionality for calculating the mathematical transformations may be implemented in hardware, e.g. by using dedicated decoder hardware, i.e. the processing units. In other words, the processing circuitry/means may be implemented by application-specific integrated circuitry, using logical gates and memory cells that are purpose-built for providing the functionality of the processing circuitry. For example, each processing unit may be configured to process one column of the matrix at a time, e.g. within one time slot/clock cycle. In other words, each processing unit may process one column of the matrix at a time.

In various implementations, the matrix may be a quasi-cyclic matrix. In a "quasi-cyclic matrix", the H-matrix may be made up of circulant columns and circulant rows. Each member of the circulant column or row can be obtained by rotating the bits in the circulant. This enables using just one copy of the processing logic for a circulant column—all members of the circulant column can be processed using the same logic with circular rotations. The matrix may thus comprise a plurality of circulant columns, which all comprise a pre-defined number of sub-columns and rows). Each of the circulant columns comprises a plurality of sub-columns. Each processing unit may be configured to process one sub-column of a circulant column at a time (e.g. within one time slot/clock cycle/sub-iteration).

In broad terms, the iterative decoding being performed by the control circuitry/means and processing circuitry may be implemented similar to other systems. The difference, however, lies in the assignment between processing units and calculations to be performed. As has been mentioned before, a matrix is being used in the iterative decoding, with the matrix comprising a plurality of columns and a plurality of rows. Each of the columns may be used for a codeword bit, and each of the rows may be associated with a check node bit. In various examples of the present disclosure, different (overlapping) portions of the matrix may be used for iterative decoding of different codeword sizes.

In the context of the present disclosure, the decoding apparatus, device, and method are suitable for decoding codewords having two or more different lengths (i.e. number of bits in the codeword). In other words, the codeword might have one of two or more pre-defined lengths.

The control circuitry is configured to operate in the first mode of operation to process a codeword having the first length, and to operate in the second mode of operation to process a codeword having the second length, with the first length and second length being different. The first length may be shorter than the second length. For example, the second length may be at least twice as long (e.g. exactly twice as long), or at least four times as long (e.g. exactly 4 times as long), or at least 8 times as long (e.g. exactly 8 times as long) as the first length. For example, as shown in some examples of the present disclosure, the first length may be 512 Bytes long, and the second length may be 2 Kilobytes long. Similarly, the control circuitry may be configured to operate in the third mode of operation to process a codeword having a third length, e.g. having a length of 1 Kilobytes or 4 Kilobytes. Depending on the mode of operation, the plurality of processing units may be used differently. In particular, depending on the mode of operation, multiplexing of processing units across partitions of the matrix may be performed or not.

As has been mentioned before, the iterative decoding is based on a parity-check matrix, which is sub-divided into two or more partitions. The multiplexing of the plurality of processing units is based on the partitioning of the matrix.

The control circuitry is configured to multiplex the utilization of the plurality of processing units across the two or more partitions of the matrix at least in the second mode of operation. In this context, the term "multiplexing the utilization of the plurality of processing units" means, that, at least in the second mode of operation, in each time slot (i.e. the time it takes a processing unit to perform a calculation, i.e. a sub-iteration, which may be a clock cycle of the decoder) of a plurality of time slots required for completing an iteration of the iterative decoding, a given processing unit is applied on a different partition of the two or more partitions.

For example, the control circuitry may be configured to control the utilization of the plurality of time slots such, that the plurality of processing units are applied to a first partition of the two or more partitions in a first time-slot of the plurality of time slots, and to a second partition of the two or more partitions in a second time-slot of the plurality of time slots, etc. (at least in the second mode of operation).

For example, in each time-slot of the iterations, the plurality of processing units may be applied to a different partition of the two or more partitions (at least in the second mode of operation). In other words, the control circuitry may be configured to perform the iterative decoding over one or more iterations (of the iterative decoding). Accordingly, the method may comprise performing the iterative decoding over one or more iterations. The control circuitry may be configured to iterate over the partition or partitions being used in the respective mode of operation in each iteration to multiplex the utilization of the plurality of processing units across the respective partition or partitions. Accordingly, the method may comprise iterating 235 over the partition or partitions being used in the respective mode of operation in each iteration to multiplex the utilization of the plurality of processing units across the respective partition or partitions.

In effect, the proposed concept spreads the decoding of the larger codewords into multiple time slots, without affecting their error correction performance; so that (LDPC) codes with vastly different block lengths can use the same decoder for decoding. An example for this is given in connection with FIG. 6, for example, where the matrix is sub-divided into four partitions. For example, the partitions may have the same size, or at most one of the partitions may have a smaller size than the others.

In the first mode of operation, a different scenario may emerge, depending on the difference in code length between the first length and the second length. If the number of bits in the first length is at most the width of a partition, then no multiplexing might be required in the first mode operation, and only a single partition might be used (or different partitions in different iterations, if the sub-matrix being used for the respective codewords is repeated across partitions). For example, at least one partition (or sub-matrix of a partition) of the matrix may be used in the first mode. In this case, control circuitry may be configured to perform an iteration of the iterative decoding in a single time slot (if the plurality of processing unit comprise enough processing unit to process each column of a partition at once). If the number of bits in the first length are larger than the width of a partition, multiplexing might also be applied in the first mode of operation, albeit possibly on fewer partitions. For example, at least one of the two or more partitions may be used in the second mode of operation and disregarded in the first mode of operation during the iterative decoding of the codeword. A larger number of partitions may be used in the second mode than in the first mode, e.g. the entire matrix (each of the partitions), may be used in the second mode of operation. Additionally, at least a subset of rows of each partition may be used in the second mode of operation and disregarded in the first mode of operation during the iterative decoding of the codeword, as shorter codewords may also require fewer check nodes. The control circuitry may utilize at least a portion of the plurality of processing units both in the first mode of operation and in the second mode of operation to perform the iterative decoding, e.g. by using the same processing units to process the same partition (containing the portion of the matrix being used for decoding the codewords having the first length).

There are various metrics that are relevant for iterative decoding. One metric is the so-called speed-up. As has been mentioned before, the number of copies of processing logic for each circulant is called the "speed up" of the decoder. In general, the speed-up may be higher in the first mode of operation, as the same number of processing units can be assigned to fewer columns of the matrix. Accordingly, the number of time slots required per iteration may be lower in the first mode of operation than in the second mode of operation. The number of processing units may be fitted to the required speed up of the different operating mode, with the number of processing units being defined by the speed up of one of the operating modes requiring the maximal number of concurrently available processing units.

The input circuitry or input means 22 may correspond to one or more inputs for receiving information, which may be in digital (bit) values according to a specified code, within a module, between modules or between modules of different entities. For example, the input circuitry or input means 22 may comprise interface circuitry configured to receive information.

In examples, the control circuitry or control means 26 may be implemented using one or more processing units, one or more processing devices, any means for processing, such as a processor, a computer or a programmable hardware component being operable with accordingly adapted software. In other words, the described function of the processing circuitry or processing means 24 may as well be implemented in software, which is then executed on one or more programmable hardware components. Such hardware components may comprise a general-purpose processor, a Digital Signal Processor (DSP), a micro-controller, etc.

The processing circuitry or processing means 24 may be implemented using the plurality of processing units, which may be purpose-built processors for processing a column or columns of the matrix. For example, each of the plurality of processing units may comprise circuitry for performing matrix multiplication on one column of a matrix.

The output circuitry or output means 28 may correspond to one or more outputs for transmitting information, which may be in digital (bit) values according to a specified code, within a module, between modules or between modules of different entities. For example, the output circuitry or output means 28 may comprise interface circuitry configured to transmit information.

Figure 2C:
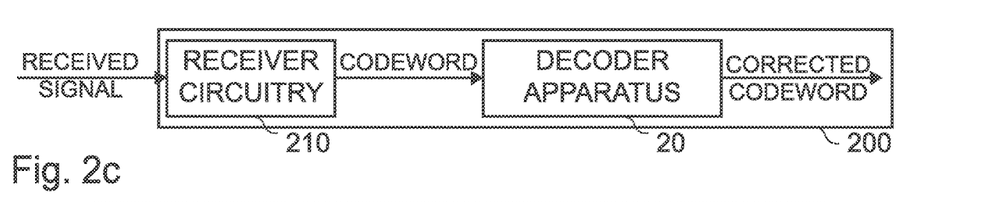
FIG. 2c shows a block diagram of an example of a communication device comprising a decoding apparatus or decoding device.

FIG. 2c shows a block diagram of an example of a communication device comprising a decoding apparatus or device 20. The communication device 200 comprises receiver circuitry (or receiver means/means for receiving) 210 and the decoding apparatus or device 20. The decoding apparatus or device is configured to decode codewords received via the receiver circuitry. For example, the receive circuitry may be configured to receive signals comprising codewords using a wireless communication system (such as a Wireless Local Area Network, or a wireless communication system as defined by the third-generation partnership projection, 3GPP) or using a wireline communication system, e.g. using a cable communication system, a digital subscriber line communication system or using a passive optical network-based communication system. For example, the communication device may be a communication device for communicating via a passive optical network.

More details and aspects of the communication device are introduced in connection with the proposed concept or one or more examples described above or below (e.g. FIG. 1a to 1b, 3 to 9). The communication device may comprise one or more additional optional features corresponding to one or more aspects of the proposed concept or one or more examples described above or below.

Figure 3:
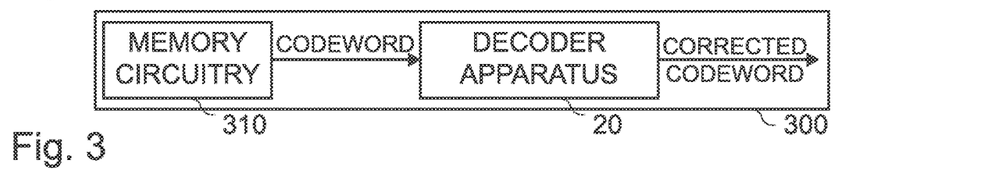
FIG. 3 shows a block diagram of an example of a memory device comprising a decoding apparatus or decoding device.

FIG. 3 shows a block diagram of an example of a memory device comprising a decoding apparatus or device 20. The memory device 300 comprises memory circuitry (or memory/memory means) 310, e.g. volatile memory or persistent memory, and the decoding apparatus or device 20. The decoding apparatus or device is configured to decode codewords obtained from the memory circuitry. For example, the memory device may be a Dual In-line Memory Module (DIMM), or a memory module having another form factor and/or connection infrastructure such as Compute Express Link (CXL), Peripheral Component Interconnect Express (PCIe) or NVMe (Non-Volatile Memory Express). In some examples, the memory device may be a persistent memory device, i.e. a memory device that enables a persistent storage of the information held in the memory. For example, the memory device may use three-dimensional cross-point memory, such as Intel® 3D XPoint™-based persistent memory.

In some examples, the memory device may be a memory device for implementing two-level memory (2LM). In some examples, where the memory device is configured as a 2LM system, the memory device 300 may serve as main memory for a computing device. For these examples, memory circuitry 310 may include the two levels of memory including cached subsets of system disk level storage. In this configuration, the main memory may include "near memory" arranged to include volatile types on memory and "far memory" arranged to include volatile or non-volatile types of memory. The far memory may include volatile or non-volatile memory that may be larger and possibly slower than the volatile memory included in the near memory. The far memory may be presented as "main memory" to an operating system (OS) for the computing device while the near memory is a cache for the far memory that is transparent to the OS. The management of the 2LM system may be done by a combination of logic and modules executed via processing circuitry (e.g., a CPU) of the computing device. Near memory may be coupled to the processing circuitry via high bandwidth, low latency means for efficient processing. Far memory may be coupled to the processing circuitry via low bandwidth, high latency means.

In some examples, the memory circuitry 310 may include non-volatile and/or volatile types of memory. Non-volatile types of memory may include, but are not limited to, 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire or electrically erasable programmable read-only memory (EEPROM). Volatile types of memory may include, but are not limited to, dynamic random-access memory (DRAM) or static RAM (SRAM).

More details and aspects of the memory device are introduced in connection with the proposed concept or one or more examples described above or below (e.g. FIG. 1a to 2c, 4 to 9). The memory device may comprise one or more additional optional features corresponding to one or more aspects of the proposed concept or one or more examples described above or below.

Figure 4:
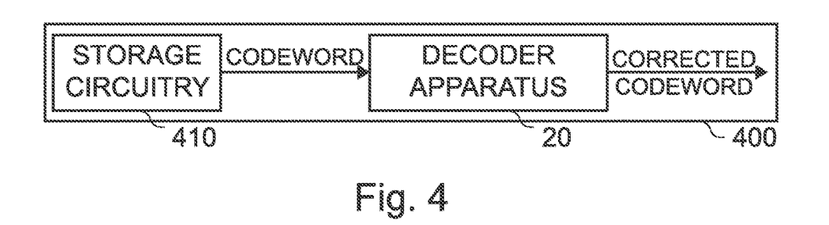
FIG. 4 shows a block diagram of an example of a storage device comprising a decoding apparatus or decoding device.

FIG. 4 shows a block diagram of an example of a storage device comprising a decoding apparatus or device 20. The storage device 400 comprises storage circuitry (or storage means/storage) 410, e.g. flash-based storage circuitry or solid-state storage circuitry, and the decoding apparatus or device 20. The decoding apparatus or device is configured to decode codewords obtained from the storage circuitry. For example, the storage device may be a solid-state storage device, e.g. a flash-based storage device, such as a solid-state drive. For example, the storage device may be a Compute Express Link (CXL)-, Peripheral Component Interconnect Express (PCIe)- or NVMe (Non-Volatile Memory Express)-based storage device. Other possible interfaces for storage devices include serial ATA (SATA), serial attached SCSI (SAS) or universal serial bus (USB). For example, the storage device may be configured to communicate with a host device via a bus, such as a Peripheral Component Interconnect (PCIe), Serial Advanced Technology Attachment (SATA), Serial Attached Small Computer System Interface (SAS)) or a network, such as the Internet, a storage area network (SAN), a local area network (LAN), etc. For example, the storage circuitry 410 may be implemented using non-volatile memory, such as 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire or electrically erasable programmable read-only memory (EEPROM). In some examples, the storage circuitry 410 may also include types of storage mediums such as optical discs to include, but not limited to, compact discs (CDs), digital versatile discs (DVDs), a high definition DVD (HD DVD) or a Blu-ray disc.

More details and aspects of the storage device are introduced in connection with the proposed concept or one or more examples described above or below (e.g. FIG. 1a to 3, 5 to 9). The storage device may comprise one or more additional optional features corresponding to one or more aspects of the proposed concept or one or more examples described above or below.

Figure 5:
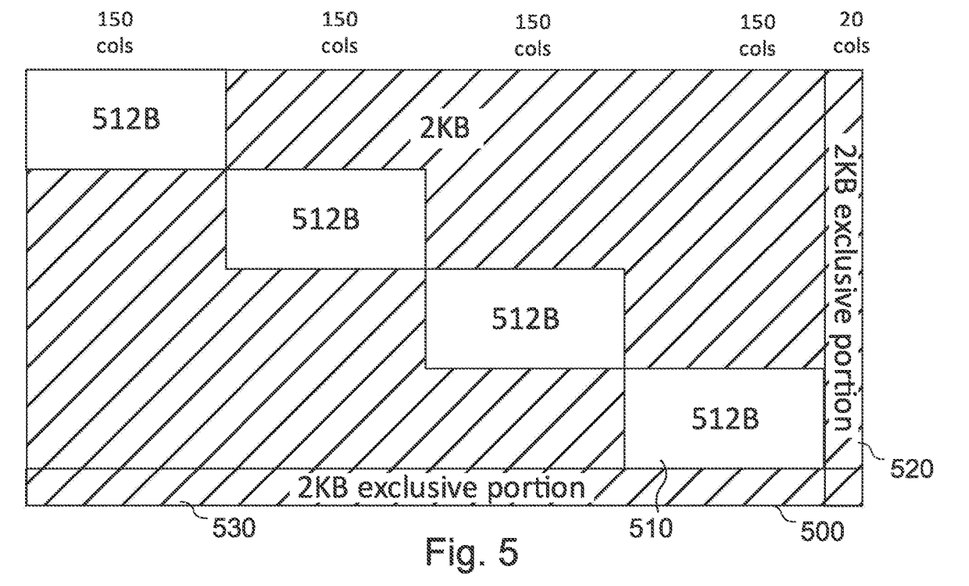
FIG. 5 shows a diagram of an exemplary matrix used in various examples.

In the following, the concept is explained in more detail with reference to two different sizes of codeword, 512B and 2 KB. Without loss of generality and for the ease of understanding, the example of the 512B code and 2 KB code from the previous sections is re-used, and typical values for some of the decoder parameters may be used to get a realistic picture of the numbers. In the example, the LDPC codes have a circulant size, Q, of 32. Let the 512B and 2 KB codes have 150 and 620 circulant columns, respectively, as shown in FIG. 5. Let the 512B and the 2 KB decoders need speed up of 4 and 1, respectively. FIG. 5 shows a diagram of an exemplary matrix used in various examples.

First, the decoding sequence of the 512B code may be described. Here, 4 sub-columns of every circulant column in the 512B matrix may be processed (to achieve a speed-up of 4). Therefore, 4×150=600 processing units may be used to process the 512B code. On the other hand, the 2 KB decoder may process 1 sub column from every circulant column in the 2 KB matrix. Therefore, 1×620=620 processing units may be required to process the 2 KB code. Therefore, an efficient decoder with optimum logic reuse might have only 620 processing units to process both 512B and 2 KB codes.

Figure 6:
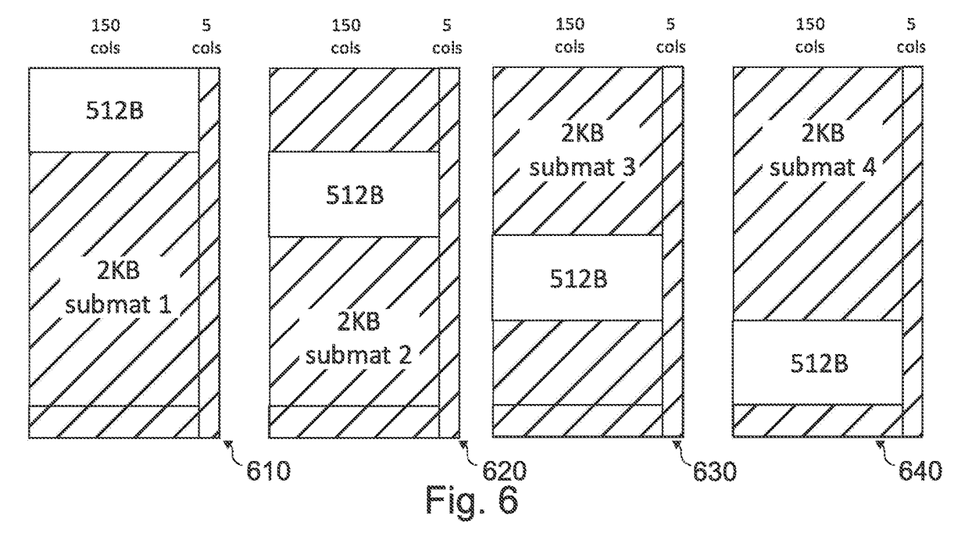
FIG. 6 shows a schematic diagram of a partitioning of a 2 KB matrix in 4 sub matrices.

To achieve this, the 2 KB matrix may be split into 4 parts (sub matrices), and the 512B matrix may be replicated 4 times, such that each part (sub matrix) has the full 512B section and a fourth of the 2 KB exclusive columns as shown in FIG. 6. FIG. 6 shows a schematic diagram of a partitioning of the 2 KB matrix in 4 sub matrices 610-640 so that each sub matrix can be processed at in a fourth of the time.

These four partitions may be logically muxed.

During operation (still referring to FIG. 6), In the 512B mode, only the sub matrix 1 of partition 610 might be active. The decoding may proceed as usual, except that only those check nodes might be used that are connected to the 512B section of sub matrix 1. At each sub iteration, 4 sub columns of the 155 circulant columns might be processed.

In the 2 KB mode, the sub-iteration processing may be further split into 4 time slots—each time slot may process one of the sub matrices. In the first time slot, 4 sub columns of each circulant column of sub-matrix 1 610 is processed. At the end of time slot 1, the submatrix may be switched to 2 620. Next, the sub-iteration processing may continue to sub-matrix 2 620, sub-matrix 3 630, and finally submat4 640. This may complete one full iteration.

The same operation may be performed for every iteration of decoding until the decoding succeeds or the maximum iteration limit is reached.

To decode a 512B code might only take 1 timeslot, and 4 timeslots may be used for decoding a 2 KB code. However, for both these decoding operations, only 620 processing units might be used, of which 600 are in use in all the time slots.

For all muxed matrices, all copies of variable nodes may be used. Therefore, for all muxed matrices, the number of bits processed per clock may be the same, equal to the capacity—which implies that wastage of hardware for smaller circulant sizes can be avoided.

Referring to the example above, an independent 2 KB decoder with speed up 1 may use exactly the same amount of logic (except for the small muxing overhead) as the flexible decoder has proposed. So a direct savings of 4× in speed up cost in comparison to logically muxing the codes may be obtained. Further, all the processing logic—620 of them—may be necessary and sufficient to meet the throughput spec. This implies that the logic utilization may be optimal for 2 KB codes. For the 512B decoder, the utilization is 600/620=97%, which is a high amount of logic reuse. Further, the 512B code and the 2 KB code may be supported using the same decoder. Thus, lower engineering (design, verification, physical design, and manufacture) cost may be obtained.

In the context of the present disclosure, various examples have been described in the context of wireless and DSL communications. However, they are equally applicable in storage applications (NAND (Not-And-based memory/storage)/three-dimensional cross point)

A flexible decoder is proposed that can support multiple LDPC codes with vastly different block lengths. It may achieve a high degree of logic reuse and zero logic wastage. Controller cost may be reduced, project execution improved, and a faster time to market reached.

Figure 7:
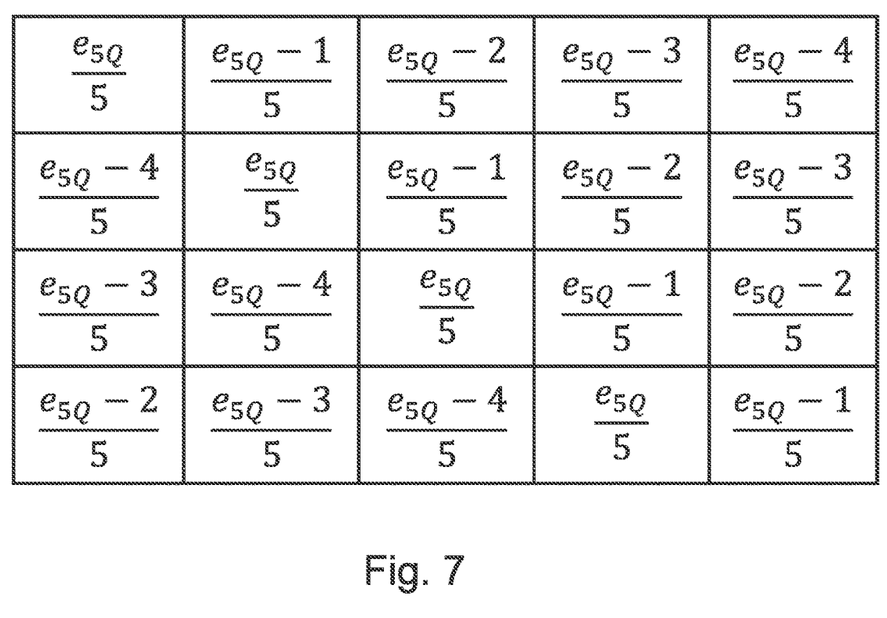
FIG. 7 shows a diagram for an exemplary transformation between matrices of different circulant sizes.

There are applications where the block length of the codes are effectively increased or decreased by changing just the size of the circulants—for example in DSL applications such as MGFast. Here, the protograph of the different LDPC codes may be the same, but their circulant sizes are different—leading to vastly different block lengths. Even in such cases, issues that were discussed above and the concept proposed in the present disclosure may be applied. In order to do that, all the matrices may be converted to the same circulant size and then the proposed approach may be applied. The details of converting such codes from circulant size of Q to an equivalent code of circulant size Q/n (n being a factor of Q) is described in connection with FIG. 7. FIG. 7 shows a diagram for an exemplary transformation between matrices of different circulant sizes.

In the following, a concept for converting a matrix from a larger circulant size Q to a smaller Q is shown. Consider a matrix that has N circulant columns and M circulant rows and a circulant size of 5*Q. This matrix can be converted to a matrix of 5*N circulant columns and 5*M circulant rows and a circulant size of Q. Without loss of generality and for the ease of understanding, the conversion is explained using the following figure for one circulant. Consider a circulant in the 5*Q matrix with the exponent $e_{5Q}$. This circulant can be further split into a 5×5 quasicyclic matrix as shown in the FIG. 7. The exponent value of each entry may be evaluated from the expression inside each cell. If the expression yields a non-integer value, then the circulant may be considered to be 0, else the result of the expression may be its exponent.

The following approach may be taken to convert a given matrix of circulant size n*Q to a matrix of circulant Q. The matrix may have n*N columns. The resulting matrix may be split into n different sub matrices, taking only 1 sub column from the original set of columns. A decoder of size N cols, n*M rows and circulant size of Q may be designed. Each of then sub matrices may be multiplexed. The above steps may be performed for all the matrices that are given, and the proposed concept may be used to time division multiplex these sub matrices.

Figure 8:
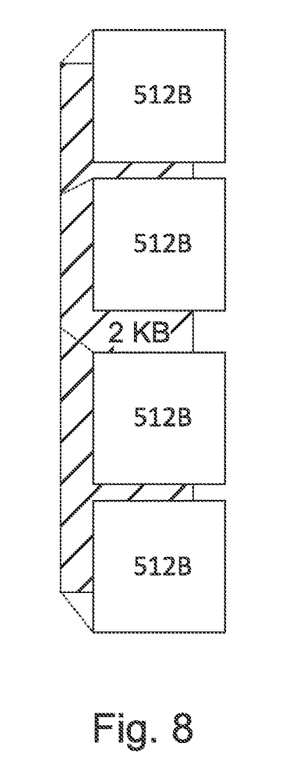
FIG. 8 shows an example of SRAM being used in an example of the present disclosure.

In various examples, a decoder is provided that supports different speed ups for different codes but has a single decode to do so. Various examples of the present disclosure may provide a low power ECC decoder that supports multiple block lengths. An Example for that is shown in FIG. 8. FIG. 8 shows an example of static random-access memory (SRAM) being used in an example of the present disclosure. Different block-length codewords may reach different depths of the same SRAM. Also, the same area in the silicon may be used for all the block lengths with similar power dissipation.

The aspects and features described in relation to a particular one of the previous examples may also be combined with one or more of the further examples to replace an identical or similar feature of that further example or to additionally introduce the features into the further example.

Example 1 relates to a decoding apparatus (20) for performing iterative decoding on a codeword, the decoding apparatus comprising processing circuitry (24) comprising a plurality of processing units. The decoding apparatus (20) comprises control circuitry (26) configured to control the iterative decoding of the codeword, the iterative decoding being based on a parity-check matrix, the matrix being sub-divided into two or more partitions, wherein the control circuitry is configured to operate in a first mode of operation to process a codeword having a first length, and to operate in a second mode of operation to process a codeword having a second length, wherein the control circuitry is configured to multiplex the utilization of the plurality of processing units across the two or more partitions of the matrix at least in the second mode of operation.

In Example 2, the subject matter of example 1 or any of the Examples described herein may further include, that the first length is shorter than the second length.

In Example 3, the subject matter of one of the examples 1 to 2 or any of the Examples described herein may further include, that the control circuitry utilizes at least a portion of the plurality of processing units both in the first mode of operation and in the second mode of operation to perform the iterative decoding.

In Example 4, the subject matter of one of the examples 1 to 3 or any of the Examples described herein may further include, that the parity check matrix is a low-density parity-check code matrix.

In Example 5, the subject matter of one of the examples 1 to 4 or any of the Examples described herein may further include, that at least one partition of the matrix is used in the first mode, and wherein the entire matrix is used in the second mode of operation.

In Example 6, the subject matter of one of the examples 1 to 5 or any of the Examples described herein may further include, that each processing unit is configured to process one column of the matrix at a time.

In Example 7, the subject matter of example 6 or any of the Examples described herein may further include, that the matrix is a quasi-cyclic matrix comprising a plurality of circulant columns, each of the circulant columns comprising a plurality of sub-columns, wherein each processing unit is configured to process one sub-column of a circulant column at a time.

In Example 8, the subject matter of one of the examples 1 to 7 or any of the Examples described herein may further include, that at least one of the two or more partitions is used in the second mode of operation and disregarded in the first mode of operation during the iterative decoding of the codeword.

In Example 9, the subject matter of one of the examples 1 to 8 or any of the Examples described herein may further include, that the control circuitry is configured to perform the iterative decoding over one or more iterations, wherein the control circuitry is configured to iterate over the partition or partitions being used in the respective mode of operation in each iteration to multiplex the utilization of the plurality of processing units across the respective partition or partitions.

In Example 10, the subject matter of one of the examples 1 to 9 or any of the Examples described herein may further include, that the decoding apparatus is suitable for performing low-density parity-check code, LDPC, iterative decoding.

Example 11 relates to a communication device comprising receiver circuitry and the decoding apparatus according to one of the examples 1 to 10, wherein the decoding apparatus is configured to decode codewords received via the receiver circuitry.

In Example 12, the subject matter of example 11 or any of the Examples described herein may further include, that the communication device is a communication device for communicating via a passive optical network.

Example 13 relates to a memory device comprising memory circuitry and the decoding apparatus according to one of the examples 1 to 10, wherein the decoding apparatus is configured to decode codewords obtained from the memory circuitry.

Example 14 relates to a storage device comprising storage circuitry and the decoding apparatus according to one of the examples 1 to 10, wherein the decoding apparatus is configured to decode codewords obtained from the storage circuitry.

Example 15 relates to a decoding device (20) for performing iterative decoding on a codeword, the decoding device comprising processing means (24) comprising a plurality of processing units. The decoding device (20) comprises control means (26) configured to control the iterative decoding of the codeword, the iterative decoding being based on a parity-check matrix, the matrix being sub-divided into two or more partitions, wherein the control means is configured to operate in a first mode of operation to process a codeword having a first length, and to operate in a second mode of operation to process a codeword having a second length, wherein the control means is configured to multiplex the utilization of the plurality of processing units across the two or more partitions of the matrix at least in the second mode of operation.

In Example 16, the subject matter of example 15 or any of the Examples described herein may further include, that the first length is shorter than the second length.

In Example 17, the subject matter of one of the examples 15 to 16 or any of the Examples described herein may further include, that the control means utilizes at least a portion of the plurality of processing units both in the first mode of operation and in the second mode of operation to perform the iterative decoding.

In Example 18, the subject matter of one of the examples 15 to 17 or any of the Examples described herein may further include, that the parity check matrix is a low-density parity-check code matrix.

In Example 19, the subject matter of one of the examples 15 to 18 or any of the Examples described herein may further include, that at least one partition of the matrix is used in the first mode, and wherein the entire matrix is used in the second mode of operation.

In Example 20, the subject matter of one of the examples 15 to 19 or any of the Examples described herein may further include, that each processing unit is configured to process one column of the matrix at a time.

In Example 21, the subject matter of example 20 or any of the Examples described herein may further include, that the matrix is a quasi-cyclic matrix comprising a plurality of circulant columns, each of the circulant columns comprising a plurality of sub-columns, wherein each processing unit is configured to process one sub-column of a circulant column at a time.

In Example 22, the subject matter of one of the examples 15 to 21 or any of the Examples described herein may further include, that at least one of the two or more partitions is used in the second mode of operation and disregarded in the first mode of operation during the iterative decoding of the codeword.

In Example 23, the subject matter of one of the examples 15 to 22 or any of the Examples described herein may further include, that the control means is configured to perform the iterative decoding over one or more iterations, wherein the control means is configured to iterate over the partition or partitions being used in the respective mode of operation in each iteration to multiplex the utilization of the plurality of processing units across the respective partition or partitions.

In Example 24, the subject matter of one of the examples 15 to 23 or any of the Examples described herein may further include, that the decoding device is suitable for performing low-density parity-check code, LDPC, iterative decoding.

Example 25 relates to a communication device comprising receiver means and the decoding device according to one of the examples 15 to 24, wherein the decoding device is configured to decode codewords received via the receiver means.

In Example 26, the subject matter of example 25 or any of the Examples described herein may further include, that the communication device is a communication device for communicating via a passive optical network.

Example 27 relates to a memory device comprising memory means and the decoding device according to one of the examples 15 to 24, wherein the decoding device is configured to decode codewords obtained from the memory means.

Example 28 relates to a storage device comprising storage means and the decoding device according to one of the examples 15 to 24, wherein the decoding device is configured to decode codewords obtained from the storage means.

Example 29 relates to a decoding method for performing iterative decoding on a codeword, the decoding method comprising performing (210) iterative decoding using a plurality of processing units. The decoding method comprises controlling (220) the iterative decoding of the codeword, the iterative decoding being based on a parity-check matrix, the matrix being sub-divided into two or more partitions, by operating in a first mode of operation to process a codeword having a first length, and operating in a second mode of operation to process a codeword having a second length. The decoding method comprises multiplexing (230) the utilization of the plurality of processing units across the two or more partitions of the matrix at least in the second mode of operation.

In Example 30, the subject matter of example 29 or any of the Examples described herein may further include, that the first length is shorter than the second length.

In Example 31, the subject matter of one of the examples 29 to 30 or any of the Examples described herein may further include, that at least a portion of the plurality of processing units are used both in the first mode of operation and in the second mode of operation to perform the iterative decoding.

In Example 32, the subject matter of one of the examples 29 to 31 or any of the Examples described herein may further include, that the parity check matrix is a low-density parity-check code matrix.

In Example 33, the subject matter of one of the examples 29 to 32 or any of the Examples described herein may further include, that at least one partition of the matrix is used in the first mode, and wherein the entire matrix is used in the second mode of operation.

In Example 34, the subject matter of one of the examples 29 to 33 or any of the Examples described herein may further include, that each processing unit processes one column of the matrix at a time.

In Example 35, the subject matter of example 34 or any of the Examples described herein may further include, that the matrix is a quasi-cyclic matrix comprising a plurality of circulant columns, each of the circulant columns comprising a plurality of sub-columns, wherein each processing unit is configured to process one sub-column of a circulant column at a time.

In Example 36, the subject matter of one of the examples 29 to 35 or any of the Examples described herein may further include, that at least one of the two or more partitions is used in the second mode of operation and disregarded in the first mode of operation during the iterative decoding of the codeword.

In Example 37, the subject matter of one of the examples 29 to 36 or any of the Examples described herein may further include, that the method comprises performing the iterative decoding over one or more iterations, wherein the method comprises iterating (235) over the partition or partitions being used in the respective mode of operation in each iteration to multiplex the utilization of the plurality of processing units across the respective partition or partitions.

In Example 38, the subject matter of one of the examples 29 to 37 or any of the Examples described herein may further include, that the decoding method is suitable for performing low-density parity-check code, LDPC, iterative decoding.

Example 39 relates to a machine-readable storage medium including program code, when executed, to cause a machine to perform the method of one of the examples 29 to 38.

Example 40 relates to a computer program having a program code for performing the method of one of the examples 29 to 38, when the computer program is executed on a computer, a processor, or a programmable hardware component.

Example 41 relates to a machine-readable storage including machine readable instructions, when executed, to implement a method or realize an apparatus as claimed in any pending claim or shown in any example.

Examples may further be or relate to a (computer) program including a program code to execute one or more of the above methods when the program is executed on a computer, processor, or other programmable hardware component. Thus, steps, operations, or processes of different ones of the methods described above may also be executed by programmed computers, processors, or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process, or operation may include and/or be broken up into several substeps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A decoding apparatus for performing iterative decoding on a codeword, the decoding apparatus comprising:
    processing circuitry comprising a plurality of processing units; and
    control circuitry configured to control the iterative decoding of the codeword, the iterative decoding being based on a parity-check matrix, the parity-check matrix being sub-divided into two or more partitions,
    wherein the control circuitry is configured to operate in a first mode of operation to process a codeword having a first length, and to operate in a second mode of operation to process a codeword having a second length,
    wherein the control circuitry is configured to multiplex utilization of the plurality of processing units across the two or more partitions of the parity-check matrix at least in the second mode of operation such that the plurality of processing units are applied to a different partition of the two or more partitions in each time slot of a plurality of time slots required for completing an iteration of the iterative decoding.

2. The decoding apparatus according to claim 1, wherein the first length is shorter than the second length.

3. The decoding apparatus according to claim 1, wherein the control circuitry utilizes at least a portion of the plurality of processing units both in the first mode of operation and in the second mode of operation to perform the iterative decoding.

4. The decoding apparatus according to claim 1, wherein the parity check matrix is a low-density parity-check code matrix.

5. The decoding apparatus according to claim 1, wherein at least one partition of the parity-check matrix is used in the first mode, and wherein the entire parity-check matrix is used in the second mode of operation.

6. The decoding apparatus according to claim 1, wherein each processing unit is configured to process one column of the parity-check matrix at a time.

7. The decoding apparatus according to claim 6, wherein the parity-check matrix is a quasi-cyclic matrix comprising a plurality of circulant columns, each of the circulant columns comprising a plurality of sub-columns, wherein each processing unit is configured to process one sub-column of a circulant column at a time.

8. The decoding apparatus according to claim 1, wherein at least one of the two or more partitions is used in the second mode of operation and disregarded in the first mode of operation during the iterative decoding of the codeword.

9. The decoding apparatus according to claim 1, wherein the control circuitry is configured to perform the iterative decoding over one or more iterations, wherein the control circuitry is configured to iterate over the partition or partitions being used in the respective mode of operation in each iteration to multiplex the utilization of the plurality of processing units across the respective partition or partitions.

10. The decoding apparatus according to claim 1, wherein the decoding apparatus is suitable for performing low-density parity-check code, LDPC, iterative decoding.

11. The decoding apparatus according to claim 1, wherein the decoding apparatus is a communication device comprising receiver circuitry, wherein the decoding apparatus is configured to decode codewords received via the receiver circuitry.

12. The decoding apparatus device according to claim 11, wherein the decoding apparatus is a communication device for communicating via a passive optical network.

13. The decoding apparatus according to claim 1, wherein the decoding apparatus is a memory device comprising memory circuitry, wherein the decoding apparatus is configured to decode codewords obtained from the memory circuitry.

14. The decoding apparatus according to claim 1, wherein the decoding apparatus is a storage device comprising storage circuitry, wherein the decoding apparatus is configured to decode codewords obtained from the storage circuitry.

15. A decoding method for performing iterative decoding on a codeword, the decoding method comprising:
    performing iterative decoding using a plurality of processing units;
    controlling the iterative decoding of the codeword, the iterative decoding being based on a parity-check matrix, the parity-check matrix being sub-divided into two or more partitions, by operating in a first mode of operation to process a codeword having a first length, and operating in a second mode of operation to process a codeword having a second length; and
    multiplexing utilization of the plurality of processing units across the two or more partitions of the parity-check matrix at least in the second mode of operation such that the plurality of processing units are applied to a different partition of the two or more partitions in each time slot of a plurality of time slots required for completing an iteration of the iterative decoding.

16. The decoding method according to claim 15, wherein at least a portion of the plurality of processing units are used both in the first mode of operation and in the second mode of operation to perform the iterative decoding.

17. The decoding method according to claim 15, wherein the decoding method is suitable for performing low-density parity-check code, LDPC, iterative decoding.

18. A non-transitory machine-readable storage medium including program code, when executed, to cause a machine to perform a decoding method for performing iterative decoding on a codeword, the decoding method comprising:
    performing iterative decoding using a plurality of processing units;
    controlling the iterative decoding of the codeword, the iterative decoding being based on a parity-check matrix, the parity-check matrix being sub-divided into two or more partitions, by operating in a first mode of operation to process a codeword having a first length, and operating in a second mode of operation to process a codeword having a second length; and
    multiplexing utilization of the plurality of processing units across the two or more partitions of the parity-check matrix at least in the second mode of operation such that the plurality of processing units are applied to a different partition of the two or more partitions in each time slot of a plurality of time slots required for completing an iteration of the iterative decoding.

19. The non-transitory machine-readable storage medium according to claim 18, wherein at least a portion of the plurality of processing units are used both in the first mode of operation and in the second mode of operation to perform the iterative decoding.

20. The non-transitory machine-readable storage medium according to claim 18, wherein the decoding method is suitable for performing low-density parity-check code, LDPC, iterative decoding.

* * * * *